US012564094B2

(12) United States Patent
Nomann et al.

(10) Patent No.: US 12,564,094 B2
(45) Date of Patent: Feb. 24, 2026

(54) POWER SEMICONDUCTOR MODULE ARRANGEMENT AND METHOD FOR PRODUCING THE SAME

(71) Applicant: Infineon Technologies AG, Neubiberg (DE)

(72) Inventors: Marianna Nomann, Ruethen (DE); Elena Zwar, Dortmund (DE)

(73) Assignee: Infineon Technologies AG, Neubiberg (DE)

( * ) Notice: Subject to any disclaimer, the term of this patent is extended or adjusted under 35 U.S.C. 154(b) by 807 days.

(21) Appl. No.: 17/403,023

(22) Filed: Aug. 16, 2021

(65) Prior Publication Data

US 2022/0051960 A1 Feb. 17, 2022

(30) Foreign Application Priority Data

Aug. 17, 2020 (EP) ..................................... 20191363

(51) Int. Cl.
H01L 23/24 (2006.01)
H01L 21/54 (2006.01)
(Continued)

(52) U.S. Cl.
CPC .............. H01L 23/24 (2013.01); H01L 21/54 (2013.01); H01L 21/56 (2013.01); H01L 23/295 (2013.01);
(Continued)

(58) Field of Classification Search
CPC ... H01L 2924/181; H01L 21/56; H01L 23/24; H01L 23/3135; H01L 23/295;
(Continued)

(56) References Cited

U.S. PATENT DOCUMENTS 5,007,478 A 4/1991 Sengupta
6,848,500 B1 2/2005 Langari et al.
(Continued)

FOREIGN PATENT DOCUMENTS

DE 102013216035 B3 1/2015
EP 3511977 A1 7/2019
(Continued)

OTHER PUBLICATIONS

Exploring the Performance of Silicone Gels at High and Low Temperature, Carlos Montemayer, Dow Corning Corporation, Midland, MI 2011 (Year: 2011).*
(Continued)

*Primary Examiner* — William B Partridge
*Assistant Examiner* — David Paul Sedorook
(74) *Attorney, Agent, or Firm* — Murphy, Bilak & Homiller, PLLC

(57) ABSTRACT

A power semiconductor module arrangement comprises a substrate comprising a dielectric insulation layer, and a first metallization layer attached to the dielectric insulation layer, at least one semiconductor body mounted on the first metallization layer, and a first layer comprising an encapsulant, the first layer being arranged on the substrate and covering the first metallization layer the at least one semiconductor body, wherein the first layer is configured to release liquid or oil at temperatures exceeding a defined threshold temperature.

11 Claims, 3 Drawing Sheets

(51) Int. Cl.

| | |
|---|---|
| *H01L 21/56* | (2006.01) |
| *H01L 23/29* | (2006.01) |
| *H01L 23/31* | (2006.01) |
| *H01L 23/498* | (2006.01) |

(52) U.S. Cl.
CPC .... *H01L 23/3142* (2013.01); *H01L 23/49822* (2013.01); *H01L 23/49844* (2013.01)

(58) Field of Classification Search
CPC .............. H01L 23/296; H01L 23/3142; H01L 2224/32238; H01L 2224/45014; H01L 2224/48227; H01L 2224/48229; H01L 2224/48472; H01L 23/22
See application file for complete search history.

(56) References Cited

U.S. PATENT DOCUMENTS

| | | | |
|---|---|---|---|
| 2003/0202306 A1 | 10/2003 | Dubhashi | |
| 2005/0287352 A1 | 12/2005 | Myers et al. | |
| 2009/0298235 A1* | 12/2009 | Kostiew | H01L 23/42 |
| | | | 438/118 |
| 2010/0065962 A1* | 3/2010 | Bayerer | H01L 24/49 |
| | | | 257/E23.009 |

| | | | |
|---|---|---|---|
| 2013/0056788 A1* | 3/2013 | Haraguchi | H01L 33/486 |
| | | | 257/E33.059 |
| 2013/0056883 A1* | 3/2013 | Furukawa | H01L 23/24 |
| | | | 257/782 |
| 2014/0079953 A1* | 3/2014 | Esseghir | H01F 27/34 |
| | | | 428/413 |
| 2014/0284624 A1* | 9/2014 | Beer | H01L 25/50 |
| | | | 257/77 |
| 2015/0146399 A1* | 5/2015 | Viswanathan | B23K 20/023 |
| | | | 228/180.1 |
| 2017/0053847 A1 | 2/2017 | Takematsu et al. | |
| 2019/0189553 A1* | 6/2019 | Hohlfeld | H01L 23/3672 |
| 2020/0027839 A1* | 1/2020 | Hino | H01L 23/3735 |
| 2020/0166835 A1* | 5/2020 | Oda | B29C 59/02 |
| 2021/0375707 A1* | 12/2021 | Teixeira De Queiros | |
| | | | H01L 23/315 |

FOREIGN PATENT DOCUMENTS

| | | |
|---|---|---|
| JP | 2012109451 A | 6/2012 |
| WO | 2012152777 A1 | 11/2012 |
| WO | 2018057040 A1 | 3/2018 |

OTHER PUBLICATIONS www.chemicalbook.com (Year: 2024).*

* cited by examiner

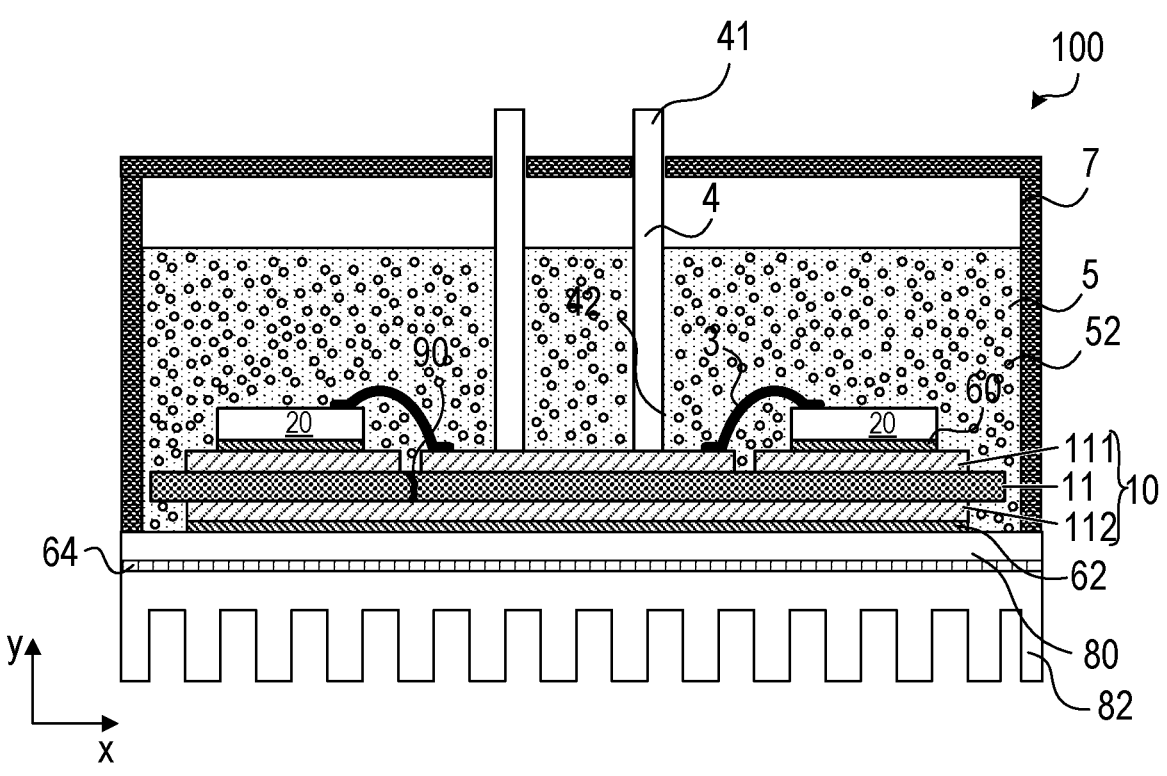
FIG 3
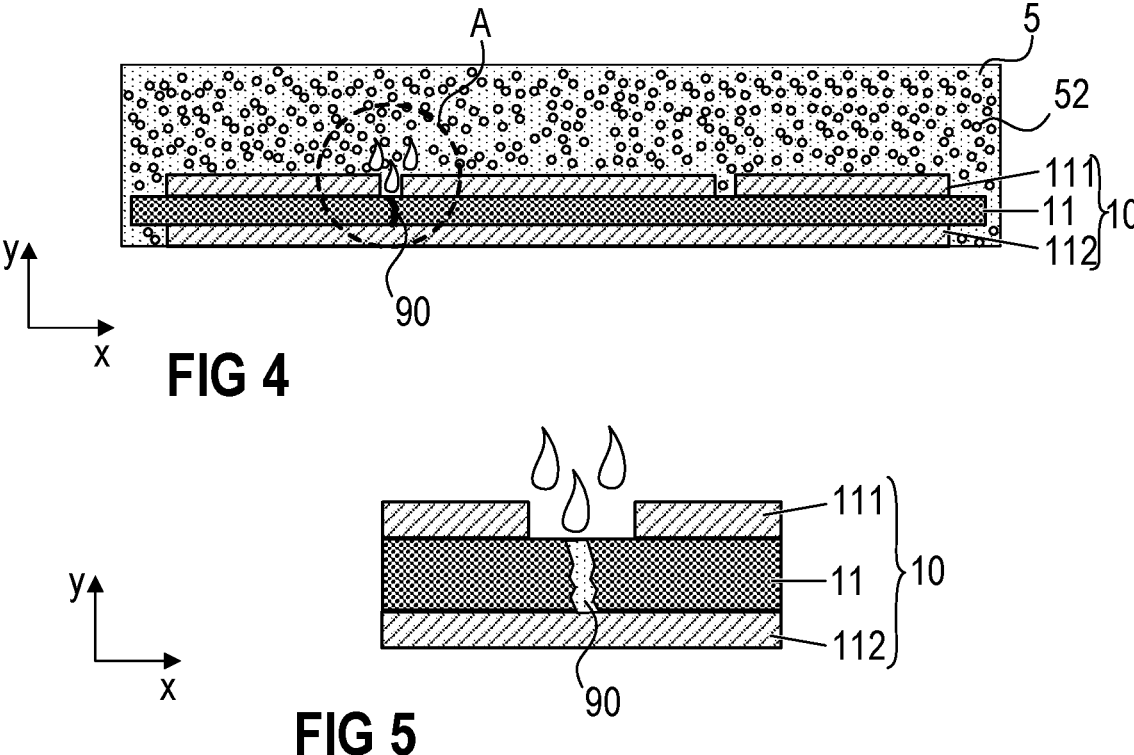
FIG 4
FIG 5

POWER SEMICONDUCTOR MODULE ARRANGEMENT AND METHOD FOR PRODUCING THE SAME

TECHNICAL FIELD

The instant disclosure relates to a power semiconductor module arrangement and to a method for producing such a power semiconductor module arrangement.

BACKGROUND

Power semiconductor module arrangements often include a base plate within a housing. At least one substrate is arranged on the base plate. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer is usually attached to the base plate by means of a solder layer or a sintering layer. The controllable semiconductor elements are usually mounted to the first metallization layer by means of a solder or a sintering layer.

The substrate layer, the metallization layers, the solder or sinter layers, and the controllable semiconductor elements usually have different CTEs (coefficients of thermal expansion). When heat is generated during the operation of the semiconductor arrangement, and when the different components subsequently cool down again, the difference between the CTEs of the different materials (e.g., copper, aluminum, solder) may result in unwanted cracks in the substrate layer. Such cracks may extend through the complete substrate layer from a first surface on which the first metallization layer is mounted to a second surface on which the second metallization layer is mounted. This may negatively affect the operation of the power semiconductor module and in the worst case even lead to a complete failure of the power semiconductor module arrangement.

There is a need for a power semiconductor module arrangement that reduces or even avoids the drawbacks mentioned above as well as others and for a method which allows to produce power semiconductor module arrangements with an increased performance and reliability.

SUMMARY

A power semiconductor module arrangement includes a substrate including a dielectric insulation layer, and a first metallization layer attached to the dielectric insulation layer, at least one semiconductor body mounted on the first metallization layer, and a first layer including an encapsulant, the first layer being arranged on the substrate and covering the first metallization layer and the at least one semiconductor body, wherein the first layer is configured to release liquid or oil at temperatures exceeding a defined threshold temperature.

A method includes arranging at least one semiconductor body on a substrate, the substrate including a dielectric insulation layer, and a first metallization layer attached to the dielectric insulation layer, and forming a first layer on the substrate, thereby covering the first metallization layer and the at least one semiconductor body, the first layer including an encapsulant, wherein the first layer is configured to release liquid or oil at temperatures exceeding a defined threshold temperature.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 3 schematically illustrates a cross-sectional view of a power semiconductor module arrangement according to one example.

FIG. 4 schematically illustrates a cross-sectional view of a semiconductor substrate enclosed by an encapsulant according to one example.

FIG. 5 schematically illustrates a detail of the semiconductor substrate of FIG. 4.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connectable pads and includes at least one semiconductor element with electrodes.

Figures 1, 2:
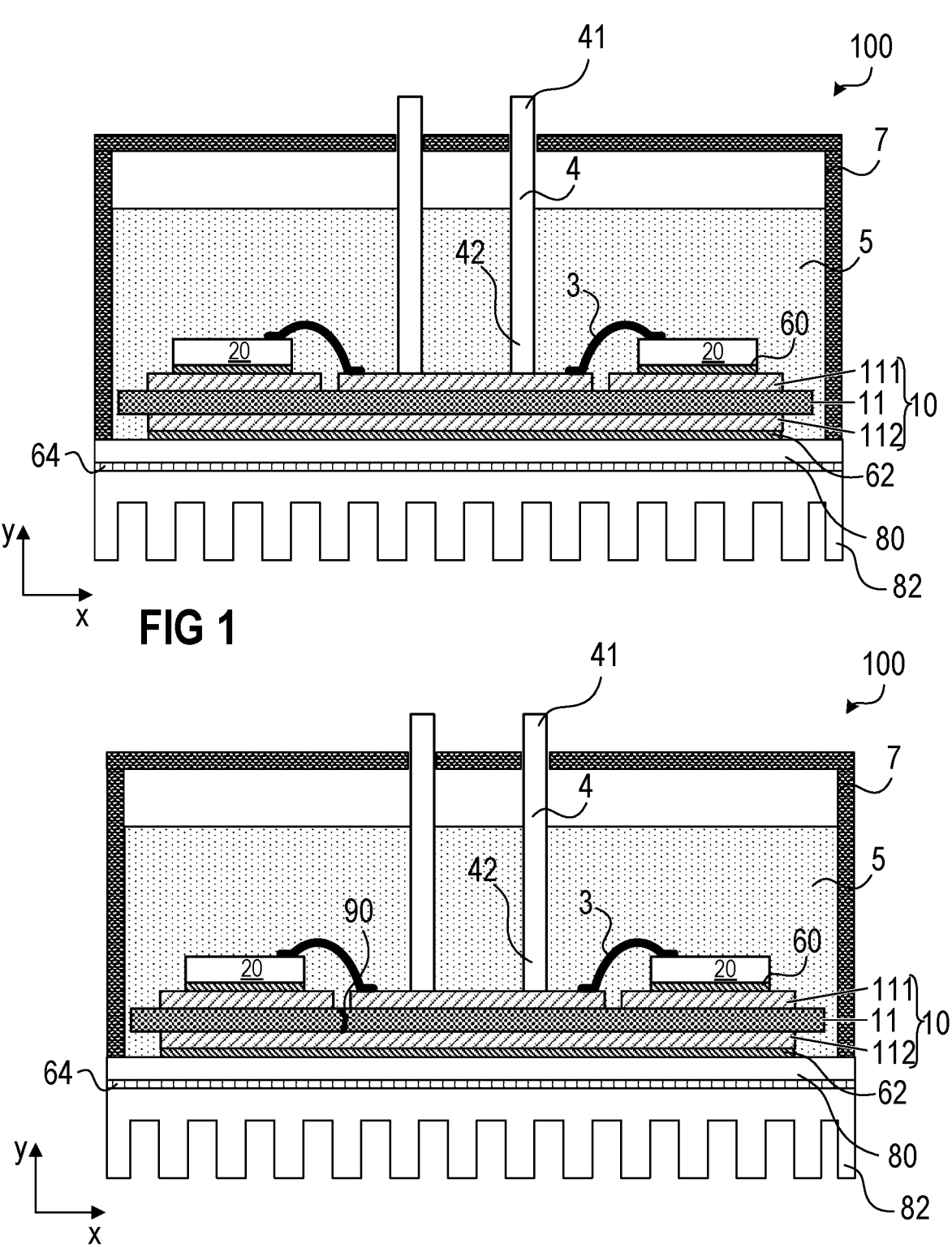
FIG. 1 is a cross-sectional view of a power semiconductor module arrangement.
FIG. 2 is a cross-sectional view of a defective power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials:

copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 80 which forms a base surface of the housing 7, while the housing 7 itself solely comprises sidewalls and a cover. In some power semiconductor module arrangements 100, more than one substrate 10 is arranged on the same base plate 80 and within the same housing 7. The base plate 80 may comprise a layer of a metallic material such as, e.g., copper or AlSiC. Other materials, however, are also possible.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. According to another example, the second metallization layer 112 may be a structured layer. According to other examples, the second metallization layer 112 may be omitted altogether. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer 111 may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver (Ag) powder, for example.

The power semiconductor module arrangement 100 illustrated in FIG. 1 further includes terminal elements 4. The terminal elements 4 provide an electrical connection between the inside and the outside of the housing 7. The terminal elements 4 may be electrically connected to the first metallization layer 111 with a second end 42, while a first end 41 of the terminal elements 4 protrudes out of the housing 7. The terminal elements 4 may be electrically contacted from the outside at their first end 41.

Arranging the terminal elements 4 centrally on the substrate 10 is only an example According to other examples, terminal elements 4 may be arranged closer to or adjacent to the sidewalls of the housing 7. The second end 42 of a terminal element 4 may be electrically and mechanically connected to the substrate 10 by means of an electrically conductive connection layer (not specifically illustrated in FIG. 1). Such an electrically conductive connection layer may be a solder layer, a layer of an electrically conductive adhesive, or a layer of a sintered metal powder, e.g., a sintered silver (Ag) powder, for example. Alternatively, the terminal elements 4 may also be coupled to the substrate by means of ultrasonic welding.

The power semiconductor module arrangement 100 may further include an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their first ends 41, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged inside the housing 7, from certain environmental conditions and mechanical damage. It is generally also possible to omit the housing 7 and solely protect the substrate 10 and any components mounted thereon with an encapsulant 5. In this case, the encapsulant 5 may be a rigid material, for example.

During the use of the power semiconductor module arrangement 100, the electrically conductive connection layer 60, the dielectric insulation layer 11, the first metallization layer 111, and the second metallization layer 112 may be heated to a certain degree. This is because at least some semiconductor bodies 20 of the power semiconductor module arrangement 100 generally perform a plurality of switching operations during the operation of the power semiconductor module arrangement 100. When performing many switching operations within a short period of time, for example, the semiconductor bodies 20 generate heat which, in the worst case, may rise to a temperature above a certain maximum threshold. Heat generated during the operation of the power semiconductor module arrangement 100 is usually dissipated from the semiconductor bodies 20 to the substrate 10 and further through the base plate 80 to a heat sink 82. A heat conducting layer 64 is generally arranged between the base plate 80 and the heat sink 82.

Increased temperatures may cause cracks to form in the dielectric insulation layer 11. Such a crack 90 in the dielectric insulation layer 11 is schematically illustrated in FIG. 2. One reason for the possible formation of cracks is the fact that the materials of the first metallization layer 111, the dielectric insulation layer 11, the second metallization layer 112, the electrically conductive connection layer 60, and the semiconductor bodies 20 generally have different thermal expansion coefficients. That is, when heated, the different materials expand to different degrees. The same applies when the materials subsequently cool down again.

The cracks in the dielectric insulation layer 11 may negatively affect the operation of the power semiconductor module arrangement 100 or may even lead to the complete failure of the power semiconductor module arrangement. A crack 90 may reduce the insulating properties of the dielectric insulation layer 11. For example, a crack may extend through the dielectric insulation layer 11 all the way from the first surface on which the first metallization layer 111 is arranged to the opposite second surface on which the second metallization layer 112 is arranged. Cracks often occur in those regions of the dielectric insulation layer 11 that are arranged close to the edges of the different sections of the metallization layers 111, 112. In the example illustrated in FIG. 2, for example, the crack 90 is formed in a region of the dielectric insulation layer 11 that is arranged below a recess between two different sections of the first metallization layer 111. In this way an electrically conducting path may be formed in the normally dielectrically insulating dielectric insulation layer 11. That is, leaking currents may occur in the dielectric insulation layer 11, resulting in unwanted short-circuits.

Now referring to FIG. 3, a power semiconductor module arrangement 100 according to one example is exemplarily illustrated. The general structure of the power semiconductor module arrangement 100 corresponds to the power semiconductor module arrangement 100 as has been described with respect to FIG. 1 above. However, the encapsulant 5 of the power semiconductor module arrangement of FIG. 3 differs from the encapsulant 5 of the power semiconductor module arrangement 100 as illustrated in FIG. 1. A second material (e.g., additive or filler) 52 may be distributed within the encapsulant 5. The encapsulant 5 of the power semiconductor arrangement 100 of FIG. 3, or in particular the second material 52, liquefies at temperatures above a certain threshold temperature. The threshold temperature may be 120° C., for example. It is, however, also possible that the encapsulant 5 liquefies at lower or higher temperatures. That is, when a semiconductor body 20 or any of the other components of the power semiconductor module arrangement 100 heats up to above the threshold temperature, the encapsulant 5 in a region directly adjoining the concerned component is also heated and may subsequently at least partially liquefy in the concerned region. The encapsulant 5 with at least releases a certain amount of liquid in the concerned region. The temperatures of the semiconductor bodies 20 or the other components usually do not persist long enough in order to heat up all of the encapsulant 5. Even further, heat may be generated in limited areas only. That is, the encapsulant 5 will not liquefy completely but only partially in a defined area directly surrounding the heated component.

If, due to the high temperatures, a crack 90 forms in the dielectric insulation layer 11, the released liquid may flow into the crack 90, thereby filling the crack 90 with dielectrically insulating material. In this way, any unwanted electrically conducting paths may be sealed by the material of the encapsulant 5. This is schematically illustrated in FIGS. 4 and 5 which illustrate the concerned section of the dielectric insulation layer 11 with a crack 90 formed therein in more detail. FIG. 5 illustrates the detail A of FIG. 4 in more detail. The liquefaction of the encapsulant 5 is indicated with droplets in FIGS. 4 and 5. Once the concerned component and the encapsulant 5 have cooled down again, the material released from the encapsulant 5 remains in the crack 90, thereby permanently sealing the crack 90. In this way, even if cracks 90 do form in the dielectric insulation layer 11, the lifetime of the power semiconductor module arrangement 100 may be significantly increased.

As has been described above, the encapsulant 5 may comprise silicone. The encapsulant 5 may comprise at least one of the following properties. The encapsulant 5, for example may comprise a high amount of liquid. According to one example, the encapsulant 5 comprises at least 55 wt.-% or at least 60 wt.-% of liquid. Other values, however, are also possible. A large amount of liquid may be achieved by adding non-reactive silicone oil 52 to a silicone gel (encapsulant 5), before filling the silicone gel into the housing 7 and curing it. Non-reactive components such as silicone oil may remain in the encapsulant 5 after curing the encapsulant 5. The non-reactive silicon oil 52 may be evenly distributed within the material of the encapsulant 5. Any liquid constituents 52 of the encapsulant 5 may be released at temperatures above the defined threshold temperature (e.g., above 120° C.). According to another example, beads of silicone 52 may be added to a silicone gel 5, wherein the silicone beads 52 melt at a temperature equal to or above the desired temperature (e.g., 120° C.). It is also possible to add beads of a phase change material 52 to the encapsulant 5, wherein the beads of the phase change material liquefy at temperature equal to or above the desired temperature (e.g., 120° C.).

The encapsulant 5 may have a dielectric strength of at least 16 kV/mm or at least 17 kV/mm, for example. Other values of the dielectric strength, however, are also possible. The dielectric strength of the encapsulant 5 may depend on the currents occurring in the power semiconductor module arrangement 100 during operation. The encapsulant 5 may further have a specific resistance of at least $2*10^{15}$ Ωcm or at least $2.5*10^{15}$ Ωcm, for example. The specific resistance, however, may vary depending on the specific application and the currents and voltages occurring in the power semiconductor module arrangement 100 during operation. The viscosity of the liquid or oil released from the encapsulant 5 may be lower than 1 mPas. A surface tension of the liquid or oil released from the encapsulant 5 at room temperature may be less than 25 $mNm^{-1}$.

The encapsulant 5 as described with respect to FIGS. 3 to 5 above may be formed in the same way as conventional encapsulants 5 as used in the power semiconductor module arrangement 100 of FIG. 1. That is, after assembly of the components of the power semiconductor module arrangement 100 and before completely closing and sealing the housing 7, the encapsulant 5 may be filled into the housing 7 to cover the semiconductor substrate 10 and the different components mounted thereon. The second material 52 may be evenly distributed within the encapsulant 5 before filling the encapsulant into the housing 7. The encapsulant 5 may subsequently be hardened to a certain degree. Usually, the encapsulant 5 has a liquid or gel like texture when it is filled into the housing 7. The encapsulant 5 may be hardened to a certain degree by at least partial curing it. That is, chemical bonds or connections are formed between the constituents of the encapsulant 5. To achieve this, the encapsulant 5 may be heated, for example.

As has been described with respect to FIG. 3 above, the second material 52 (e.g., silicone oil, silicone beads, beads of phase change material) may be evenly distributed throughout the encapsulant 5. That is, a single layer comprising both the encapsulant 5 and the second material 52 may be formed to cover the semiconductor substrate 10 and the components mounted thereon. This, however, is only an example.

Figure 6:
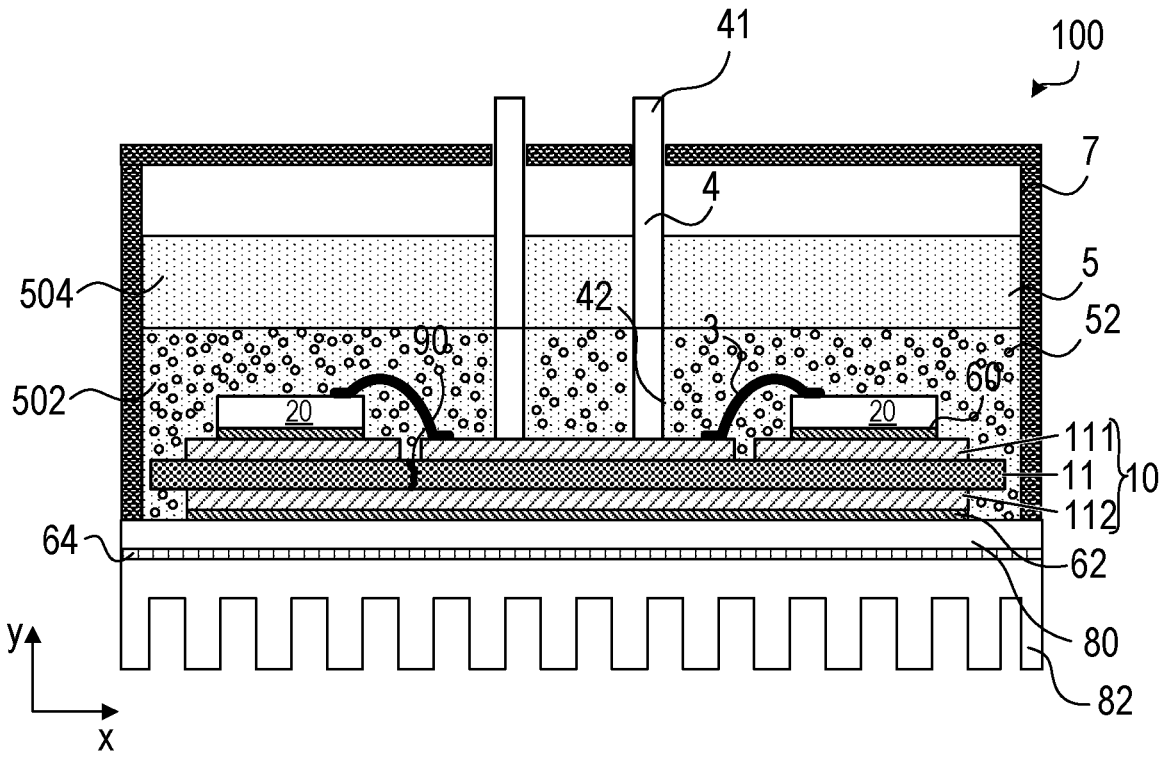
FIG. 6 schematically illustrates a cross-sectional view of a power semiconductor module arrangement according to another example.

As is exemplarily illustrated in FIG. 6, it is also possible to form a first layer 502 adjacent to the semiconductor substrate 10. The first layer 502 comprises both the encapsulant 5 and the second material 52 and covers the semiconductor substrate 10 and the components mounted thereon. The first layer 502, however, may be comparably thin. A second layer 504 may be formed on the first layer 502 such that the first layer 502 is arranged between the second layer 504 and the semiconductor substrate 10. The second layer 504 may only comprise the encapsulant 5 but not the second material 52. The second material 52 is generally only needed in those sections of the encapsulant 5 arranged close to the semiconductor substrate 10 in order to be able to fill any unwanted cracks 90. However, the second material 52 is not necessarily needed in sections of the encapsulant 5 that are arranged distant from the semiconductor substrate 10.

The invention claimed is:

1. A power semiconductor module arrangement comprising:
   a substrate comprising a dielectric insulation layer, and a first metallization layer attached to the dielectric insulation layer;
   at least one semiconductor body mounted on the first metallization layer; and
   a first layer comprising an encapsulant, the first layer being arranged on the substrate and covering the first metallization layer and the at least one semiconductor body, wherein the first layer is configured to release liquid or oil at temperatures exceeding a defined threshold temperature.

2. The power semiconductor module arrangement of claim 1, wherein the encapsulant comprises a silicone gel.

3. The power semiconductor module arrangement of claim 1, wherein a second material is distributed evenly throughout the encapsulant of the first layer.

4. The power semiconductor module arrangement of claim 3, wherein the encapsulant is configured not to liquefy at temperatures exceeding the defined threshold temperature, and wherein the second material is configured to liquefy at temperatures exceeding the defined threshold temperature.

5. The power semiconductor module arrangement of claim 3, wherein the second material comprises at least one of a silicone oil, beads of silicone, and beads of a phase change material.

6. The power semiconductor module arrangement of any of claim 1, wherein the first layer is configured to release liquid or oil at temperatures of 120° C. and more.

7. The power semiconductor module arrangement of claim 1, wherein the encapsulant of the first layer comprises at least one of the following properties:
   at least 55 wt.-% or at least 60 wt.-% of liquid;
   a dielectric strength of at least 16 kV/mm or at least 17 kV/mm; and
   a specific resistance of at least $2*10^{15}$ Ωcm or at least $2.5*10^{15}$ Ωcm.

8. The power semiconductor module arrangement claim 1, wherein at least one of the following applies:
   the viscosity of the liquid or oil released from the encapsulant is lower than 1 mPas; and
   a surface tension of the liquid or oil released from the encapsulant at room temperature is less than 25 mNm$^{-1}$.

9. The power semiconductor module arrangement of claim 1, further comprising a second layer comprising an encapsulant, wherein the second layer is configured not to release liquid or oil at temperatures exceeding a defined threshold temperature, wherein the first layer is arranged between the substrate and the second layer.

10. A method comprising:
   arranging at least one semiconductor body on a substrate, the substrate comprising a dielectric insulation layer, and a first metallization layer attached to the dielectric insulation layer; and
   forming a first layer on the substrate, thereby covering the first metallization layer and the at least one semiconductor body, the first layer comprising an encapsulant, wherein
   the first layer is configured to release liquid or oil at temperatures exceeding a defined threshold temperature.

11. The method of claim 10, wherein forming the first layer comprises evenly distributing a second material throughout the encapsulant.

* * * * *